United States Patent
Boehm et al.

(10) Patent No.: US 9,372,224 B2
(45) Date of Patent: Jun. 21, 2016

(54) METHOD FOR CHECKING THE PROPER METHOD OF OPERATING OF A CURRENT SENSOR

(75) Inventors: Andre Boehm, Kornwestheim (DE); Joachim Rischen, Lake Orion, MI (US)

(73) Assignee: Robert Bosch GmbH, Stuttgart (DE)

( * ) Notice: Subject to any disclaimer, the term of this patent is extended or adjusted under 35 U.S.C. 154(b) by 556 days.

(21) Appl. No.: 13/825,497

(22) PCT Filed: Aug. 19, 2011

(86) PCT No.: PCT/EP2011/064256
§ 371 (c)(1),
(2), (4) Date: Aug. 30, 2013

(87) PCT Pub. No.: WO2012/038161
PCT Pub. Date: Mar. 29, 2012

(65) Prior Publication Data
US 2013/0335100 A1    Dec. 19, 2013

(30) Foreign Application Priority Data

Sep. 23, 2010    (DE) .......................... 10 2010 041 275

(51) Int. Cl.
*G01R 31/02*    (2006.01)
*G01R 31/08*    (2006.01)
(Continued)

(52) U.S. Cl.
CPC ............. *G01R 31/2829* (2013.01); *G01R 35/00* (2013.01); *G01R 19/00* (2013.01); *G01R 19/0084* (2013.01); *G01R 19/0092* (2013.01); *G01R 31/007* (2013.01)

(58) Field of Classification Search
CPC ............... G01R 19/00; G01R 19/0084; G01R 19/0092; G01R 31/00; G01R 31/007; G01R 31/2829; G01R 35/00

USPC ......... 324/537, 522, 500, 713, 691, 649, 600; 702/64, 57, 1
See application file for complete search history.

(56) References Cited

U.S. PATENT DOCUMENTS 7,391,184 B2 *    6/2008    Luo .................... H01M 10/441
                                                                307/48
2006/0255766 A1    11/2006    Yoon et al.
(Continued)

FOREIGN PATENT DOCUMENTS

CN    101160686 A    4/2008
DE    41 30 978 A1    4/1993
(Continued)

OTHER PUBLICATIONS

International Search Report corresponding to PCT Application No. PCT/EP2011/064256, mailed Dec. 20, 2011 (German and English language document) (7 pages).

*Primary Examiner* — Hoai-An D Nguyen
(74) *Attorney, Agent, or Firm* — Maginot, Moore & Beck LLP

(57) ABSTRACT

The disclosure describes a method for checking the proper method of operation of a current sensor which is designed to measure a battery current. During a precharge phase which begins at a time at which at least one electrical component is connected to a battery and during which the electrical component is precharged by a precharge current, at least one measured value provided by the current sensor is compared with an expected current value determined from an expected temporal profile of the precharge current. The disclosure also describes a computation unit and a battery which are designed to carry out the method according to the disclosure.

11 Claims, 1 Drawing Sheet

(51) Int. Cl.
*G01R 19/00* (2006.01)
*G01R 31/28* (2006.01)
*G01R 35/00* (2006.01)
*G01R 31/00* (2006.01)

(56) References Cited

U.S. PATENT DOCUMENTS

2007/0115604 A1   5/2007   Zettel et al.
2007/0132427 A1*  6/2007   Veselic ............... H02J 7/0052
                                              320/111
2011/0115442 A1*  5/2011   Garrastacho ....... G01R 31/3637
                                              320/157
2012/0088170 A1*  4/2012   Heo ................. H01M 8/04955
                                              429/428

FOREIGN PATENT DOCUMENTS

| | | |
|---|---|---|
| DE | 10 2007 061 729 A1 | 6/2009 |
| DE | 10 2009 000 682 A1 | 8/2010 |
| EP | 0 408 867 A2 | 1/1991 |
| JP | 2000-193698 A | 7/2000 |
| JP | 2002-543754 A | 12/2002 |
| JP | 2004-6131 A | 1/2004 |
| JP | 2006-262586 A | 9/2006 |
| JP | 2009-38925 A | 2/2009 |
| JP | 2002-267698 A | 9/2009 |

* cited by examiner

METHOD FOR CHECKING THE PROPER METHOD OF OPERATING OF A CURRENT SENSOR

This application is a 35 U.S.C. §371 National Stage Application of PCT/EP2011/064256, filed on Aug. 19, 2011, which claims the benefit of priority to Serial No. DE 10 2010 041 275.9, filed on Sep. 23, 2010 in Germany, the disclosures of which are incorporated herein by reference in their entirety.

The present disclosure relates to a method for checking the proper method of operation of a current sensor, a computation unit that is designed to perform the method in accordance with the disclosure, a battery having the computation unit in accordance with the disclosure and also a motor vehicle having the battery in accordance with the disclosure.

PRIOR ART

Nowadays, batteries that are derived from lithium ion or nickel metal hydride technologies are installed in particular in hybrid vehicles and electric vehicles, which batteries comprise a large number of electrochemical battery cells that are connected in series. A battery management unit is installed for the purpose of monitoring the battery and in conjunction with safety monitoring is intended to ensure an operating life that is as long as possible. For this purpose, the voltage of each individual battery cell together with the battery current and the battery temperature is measured and the condition is estimated (by way of example of the charge condition or of the ageing condition of the battery). In order to maximize the operating life, it is helpful to know the actual prevailing maximum capacity of the battery, in other words the maximum electrical power that can be discharged or received. If this capacity is exceeded, the ageing of the battery will be drastically accelerated.

In order to be able to obtain a precise measurement of the battery current, it is necessary to monitor the proper method of operation of the current sensors that are used in the battery management unit. In particular, it is necessary to calibrate an amplification factor and an offset of each current sensor that is used. In addition, the quality of the measurement data supplied by each current sensor can be assessed and consequently checked for plausibility.

Furthermore, methods for limiting a start-up current in an electrical network that is connected to a battery are known from the prior art, in which network the battery is pre-charged during a start-up operation, so that a start-up current that flows through a battery and a connected consumer is reduced. A pre-charging of this type can by way of example be conducted by way of a pre-charge resistor. If in a system of this type the system voltage is adapted to the battery voltage, the pre-charge resistor is short-circuited and consequently deactivated.

SUMMARY

In accordance with the disclosure, a method for checking the proper method of operation of a current sensor is provided. The current sensor is designed for the purpose of measuring a battery current. Typically, the battery current is a total current that flows through a plurality of individual battery cells that are connected in series. During a pre-charge phase at least one measured value that is supplied by the current sensor is compared with an expected current value that is determined from an expected progression with respect to time of a pre-charge current. In this case, the pre-charge phase commences at a point in time at which at least one electrical component is connected to the battery. During the pre-charge phase, the electrical component is charged by way of the pre-charge current. By virtue of the fact that the pre-charge current that is flowing through the battery during the pre-charge phase is known in its progression with respect to time, the resultant calculated expected current values can be reconciled with the values actually measured by the current sensor.

The method in accordance with the disclosure represents an extremely cost-effective method; since it renders it possible to check for plausibility or rather calibrate the current sensors that are used in a battery without having to provide additional operating components and only by way of providing suitable software in a control unit of the battery management unit.

It is preferable that the electrical component is pre-charged during the pre-charge phase by way of a pre-charge resistor, the resistance value of which is generally known. Additionally, it is preferred that the electrical component is a capacitor and the expected progression with respect to time of the pre-charge current during the pre-charge phase consequently corresponds to an exponential function. If the resistance value of the pre-charge resistor and the capacity of the capacitor are known, it is even possible to calculate the exponential progression of the pre-charge current and then to assess the quality of the measured values that are supplied by the current sensor.

In a further embodiment of the disclosure, the electrical component is pre-charged during the pre-charge phase using a pre-charge current that is constant with respect to time. A uniform pre-charging of this type can be implemented by way of a connection that supplies a current that is constant with respect to time and the magnitude of which is exactly known.

On the basis of the comparison of the measured value supplied by the current sensor with the expected current value, it is possible to check for plausibility further measured values that are supplied by the current sensor. In particular, it can be decided whether the current sensor is defective.

In addition, the current sensor can be calibrated on said basis. In particular, the amplification factor and/or the offset of the current sensor can be corrected.

Before the commencement of the pre-charge phase a measured value that is supplied by the current sensor for monitoring the proper method of operation can be used since at this point in time a negligibly low battery current and consequently a measured value that is different from zero can be taken as cause to perform a corresponding correction of the offset of the current sensor.

A further aspect of the disclosure relates to a computation unit that is designed for the purpose of performing the method in accordance with the disclosure.

A further aspect of the disclosure relates to a battery having a computation unit in accordance with the disclosure as well as a motor vehicle that comprises a computation unit in accordance with the disclosure or a battery in accordance with the disclosure. The battery in accordance with the disclosure is preferably a lithium ion battery.

BRIEF DESCRIPTION OF THE DRAWINGS

Exemplary embodiments of the disclosure are further explained with reference to the drawings and the description hereinunder. In which.

DETAILED DESCRIPTION

Figure 1:
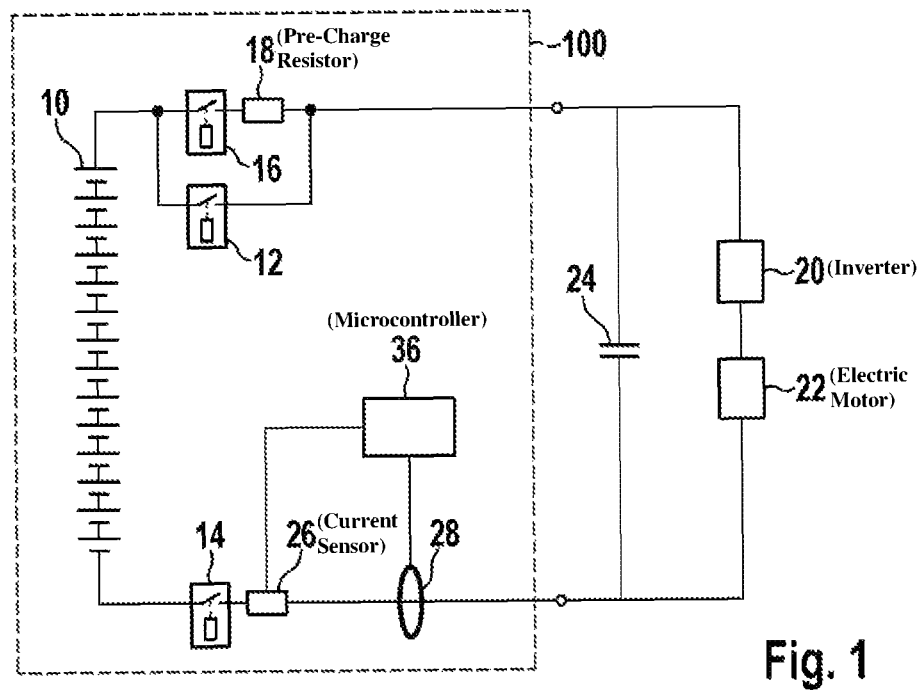
FIG. 1 illustrates an exemplary embodiment of a battery in accordance with the disclosure.

FIG. 1 shows an exemplary embodiment of a battery in accordance with the disclosure, designated as a whole by 100. The battery 100 comprises a plurality of battery cells 10 that are connected in series, in particular lithium ion battery cells. An electric motor vehicle (not illustrated) comprises the battery 100, to which an inverter 20 can be connected during the operating mode, which inverter converts a direct current, which is supplied by the battery 100, into an alternating current that drives an electric motor 22. A smoothing capacitor 24 is connected in parallel to the inverter 20 and the electric motor 22, which smoothing capacitor is used for the purpose of smoothing a high frequency voltage ripple that is generated by the inverter 20. A first positive relay 12 and a second negative relay 14 are provided on the terminals of the battery 100 and said relays can be opened in order to disconnect the electric motor vehicle from the voltage supply if said motor vehicle is parked by a user. A third relay 16 and a pre-charge resistor 18 are connected parallel to the first relay 12. At the commencement of a driving cycle, the relays 12, 14, 16 are connected in a predefined circuit sequence.

If the pre-charge resistor 18 were not provided in the battery 100, a high start-up current would flow through the battery 100 upon connecting the electrical components 20, 22, 24, said high start-up current being due to the fact that the smoothing capacitor 24 is being charged. In order to limit the start-up current, the pre-charge resistor 18 is connected by way of closing the third relay 16 upstream of the electrical components 20, 22, 24. If the pre-charge current has reduced or rather the voltage at the smoothing capacitor 24 has been adjusted to the battery voltage, the third relay 16 is opened and the first relay 12 is closed, as a consequence of which the pre-charge resistor 18 is short circuited. Any further charging of the smoothing capacitor 24 is limited in this phase only by the internal resistance of the battery 100. The pre-charging of the battery by way of the pre-charge resistor 18 prevents damage to the first relay 12.

The battery 100 comprises current sensors 26, 28 that are designed for the purpose of measuring the battery current that is flowing through the battery cells 10. A first current sensor 26 comprises a shunt-resistance across which a voltage drop is measured. A second current sensor 28 is provided in the form of a Hall sensor that supplies an output voltage that is proportional to the product of the magnetic field strength of a magnetic field that penetrates said Hall sensor and of the battery current that is to be measured. The current sensors 26, 28 can have an unknown offset and an unknown amplification factor at a predefined point in time, which by way of an example in the case of the Hall sensor 28 can be as a result of the effect of a hysteresis. The measured values of the battery current that is supplied by the current sensors 26, 28 are fed into a computation unit in the form of a microcontroller 36 that together with the current sensors 26, 28 is a part of a battery management unit that is not illustrated. In addition the microcontroller 36 controls the relays 12, 14, 16 (not illustrated in FIG. 1).

During a pre-charge phase, during which the first relay is opened and the two other relays 14, 16 are closed, the smoothing capacitor 24 is charged by way of the pre-charge resistor 18, wherein a progression with respect to time of the pre-charge current that is flowing through the battery 100 and in particular through the pre-charge resistor 18 is known and can be calculated on the basis of the known resistance value of the pre-charge resistor 18 and the capacity of the smoothing capacitor 24. The expected progression with respect to time of the pre-charge current is stored in the microcontroller 36. During the pre-charge phase the microcontroller 36 compares the two measured values that are supplied by the current sensors 26, 28 at a predefined point in time with the expected current value that corresponds to said point in time, which expected current value is determined from the progression with respect to time that is calculated and stored in the microcontroller 36. Where necessary, at a later point in time, the microcontroller 36 initiates a further comparison of the current values. The microcontroller 36 calibrates the current sensors 26, 28 on the basis of the said comparison and corrects in particular the amplification factors and/or offsets of the current sensors 26, 28. If the current sensors 26, 28 do not undergo a calibration process, then further measured values that are supplied by the current sensors 26, 28 can be subjected to at least one plausibility check. In this case, the microcontroller 36 decides whether the deviation of the measured values that are supplied by the current sensors 26, 28 from the calculated expected current value is below a predefined threshold, by way of example a percentage tolerance threshold. If the deviation exceeds the predefined threshold, the microcontroller 36 generates a warning signal that indicates that at least one of the current sensors 26, 28 is defective.

Figure 2:
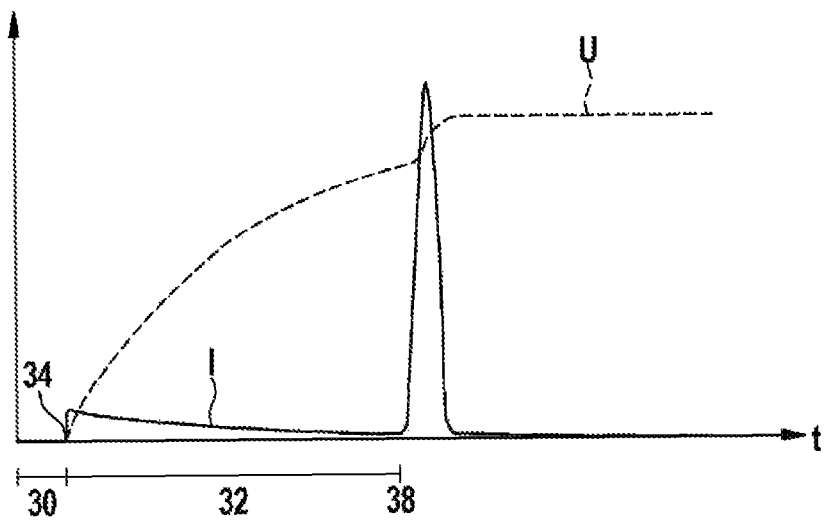
FIG. 2 illustrates the progression with respect to time of a battery current I and a voltage U that is present at an electric component that is charged during a pre-charge phase.

FIG. 2 illustrates an expected progression with respect to time of a battery/pre-charge current I and also a voltage U that is present at the smoothing capacitor 24. In a disconnected phase 30 that precedes the pre-charge phase 32, all three relays 12, 14, 16 of the battery 100 are open so that there is no current I flowing through the battery. A plausibility check can be performed on the current sensors 26, 28 to ensure that during the proper method of operation they measure that there is no current. In particular, it is possible to calibrate the offset of the two current sensors 26, 28 in a simple manner in the disconnected phase 30.

The pre-charge phase 32 commences at a point in time 34 at which the electrical components 20, 22, 24 are connected to the battery 100 by virtue of the fact that at this point in time the second, negative relay 14 and the third relay 16 are closed. In the pre-charge phase 32, the smoothing capacitor 24 is charged by way of an exponentially increasing pre-charge current I. Since both the capacity value of the smoothing capacitor 24 and also the resistance value of the pre-charge resistor 18 are known, the expected progression with respect to time of the pre-charge current I can be calculated in the pre-charge phase 32 and stored in the microcontroller 36. This similarly applies for the expected progression with respect to time of the voltage U that is present at the smoothing capacitor 24. Alternatively, the expected progression with respect to time of the pre-charge current I can be calculated by way of a comparison of the measured voltages that are present at the smoothing capacitor 24 ($U_c$) or rather on the plurality of battery cells 10 ($U_B$), in accordance with the formula $I=(U_B-U_c)/R$, wherein R is the resistance value of the pre-charge resistor 18. Expected current values are determined for different times by the microcontroller 36 from the expected progression with respect to time of the battery current I.

The current measured values that are actually supplied by the current sensors 26, 28 are compared with the corresponding expected current values by the microcontroller 36 at different points in time during the pre-charge phase 32, as a consequence of which the quality of each individual sensor 26, 28 can be assessed. At a point in time 38 at which the pre-charge current I (measured or calculated) is below a predefined threshold, the first relay 12 is closed, as a consequence of which a peak of the battery current I is generated since the charging of the smoothing capacitor 24 is only limited by the internal resistance of the battery 100. If the progression of the current peak at the point in time 38 is sufficiently known, then the method in accordance with the disclosure can also be performed in this phase that follows the pre-charge phase 32.

The invention claimed is:

1. A method for checking a proper operation of a current sensor that is configured to measure a battery current, comprising:
    pre-charging at least one electrical component by way of a pre-charge current during a pre-charge phase that commences at a point in time at which the at least one electrical component is connected to a battery;
    measuring a first current value at a first point in time using the current sensor;
    comparing the first current value with an expected current value at the first point in time that is determined from an expected progression with respect to time of the pre-charge current; and
    determining that the current sensor is operating properly in response to the first current value being within a predetermined range of the expected current value at the first point in time.

2. The method as claimed in claim 1, wherein the at least one electrical component is pre-charged during the pre-charge phase by way of a pre-charge resistor.

3. The method as claimed in claim 2, wherein:
    the at least one electrical component includes a capacitor, and
    the expected progression with respect to time of the pre-charge current during the pre-charge phase corresponds to an exponential function.

4. The method as claimed in claim 1, wherein the at least one electrical component is pre-charged during the pre-charge phase with a pre-charge current that is constant with respect to time.

5. The method as claimed in claim 1, further comprising:
    measuring further current values at further points in time using the current sensor;
    performing a plausibility check on the further current values by comparing the further current values with expected further current values that are determined from the expected progression with respect to time of the pre-charge current; and
    making a decision as to whether the current sensor is defective.

6. The method as claimed in claim 1, wherein,
    correcting at least one of an amplification factor of the current sensor and an offset of the current sensor based on the comparison of the first current value that is supplied by the current sensor with the expected current value at the first point of time.

7. The method as claimed in claim 1, wherein a current value that is measured prior to a commencement of the pre-charge phase is used to correct an offset of the current sensor.

8. The method as claimed in claim 1, wherein a computation unit is configured to perform the method.

9. A battery comprising:
    a computation unit configured to check a proper operation of a current sensor that is configured to measure a battery current by (i) pre-charging at least one electrical component by way of a pre-charge current during a pre-charge phase that commences at a point in time at which the at least one electrical component is connected to a battery, (ii) measuring a first current value at a first point in time using the current sensor, (iii) comparing the first current value with an expected current value at the first point in time that is determined from an expected progression with respect to time of the pre-charge current, and (iv) determining that the current sensor is operating properly in response to the first current value being within a predetermined range of the expected current value at the first point in time.

10. The battery as claimed in claim 9, wherein the battery includes the current sensor.

11. An electric motor vehicle, comprising:
    a battery including a current sensor configured to measure a battery current, and a computation unit configured to perform a method for checking a proper operation of the current sensor by (i) pre-charging at least one electrical component by way of a pre-charge current during a pre-charge phase that commences at a point in time at which the at least one electrical component is connected to a battery, (ii) measuring a first current value at a first point in time using the current sensor, (iii) comparing the first current value with an expected current value at the first point in time that is determined from an expected progression with respect to time of the pre-charge current, and (iv) determining that the current sensor is operating properly in response to the first current value being within a predetermined range of the expected current value at the first point in time.

* * * * *